(12) United States Patent
Schmoelz

(10) Patent No.: US 6,725,403 B1
(45) Date of Patent: Apr. 20, 2004

(54) EFFICIENT REDUNDANCY CALCULATION SYSTEM AND METHOD FOR VARIOUS TYPES OF MEMORY DEVICES

(75) Inventor: Paul Josef Maria Schmoelz, Richmond, VA (US)

(73) Assignee: Infineon Technologies Richmond, LP, Sanston, VA (US)

( * ) Notice: Subject to any disclaimer, the term of this patent is extended or adjusted under 35 U.S.C. 154(b) by 0 days.

(21) Appl. No.: 09/432,064

(22) Filed: Nov. 2, 1999

(51) Int. Cl.$^7$ .............................................. G11C 29/00
(52) U.S. Cl. ...................................... 714/723; 714/719
(58) Field of Search ................................. 714/718, 719, 714/723

(56) References Cited

U.S. PATENT DOCUMENTS

| | | | | |
|---|---|---|---|---|
| 4,817,093 A | * | 3/1989 | Jacobs et al. ................ | 714/728 |
| 5,917,764 A | * | 6/1999 | Ohsawa et al. .............. | 365/200 |
| 6,163,489 A | * | 12/2000 | Blodgett ...................... | 365/200 |
| 6,178,124 B1 | * | 1/2001 | Kaiser et al. ................ | 365/200 |
| 6,182,257 B1 | * | 1/2001 | Gillingham .................. | 714/733 |
| 6,449,741 B1 | * | 9/2002 | Organ et al. ................. | 714/724 |
| 6,539,506 B1 | * | 3/2003 | Lammers et al. ............ | 714/719 |

OTHER PUBLICATIONS

Built in Self Repair for Embedded High Density SRAM by Kim et al. International Test Conference Proceedings, pp.: 1112–1119 Oct. 18–23, 1998.*

* cited by examiner

Primary Examiner—Albert Decady
Assistant Examiner—Cynthia Britt
(74) Attorney, Agent, or Firm—Brinks Hofer Gilson & Lione

(57) ABSTRACT

A method for calculating and analyzing redundancies for semiconductor memories, in accordance with the present invention, includes providing a memory device including at least one memory chip. The at least one memory chip includes a redundancy calculation region. The at least one memory chip is tested to determine failure addresses of failed components on each memory chip. The addresses of the failed components are input to the redundancy calculation region to compare the failure addresses to previous failure addresses stored in the redundancy calculation region to determine if new failures have been discovered. If a match exists between the previous failure addresses and the failure addresses, the failure addresses which match are terminated. Otherwise, the failure addresses are stored in the redundancy calculation region. It is then determined if the at least one memory chip is fixable based on the new failures which have been discovered. A system, preferably for on-chip implementation is also included.

26 Claims, 5 Drawing Sheets

EFFICIENT REDUNDANCY CALCULATION SYSTEM AND METHOD FOR VARIOUS TYPES OF MEMORY DEVICES

BACKGROUND

1. Technical Field

This disclosure relates to testing and repairing semiconductor memories and more particularly, to a system and method for efficiently calculating and analyzing redundancies for semiconductor memories for repairing the semiconductor memories.

2. Description of the Related Art

Testing and repairing semiconductor memories is an important part of providing high reliability and controlling the quality of semiconductor memory products. A typical back-end test flow for a dynamic random access memory (DRAM) device usually includes:

1) A Wafer-Test/Redundancy Calculation. This includes testing all memory cells on a chip to determine failures. Then, determining if the failures can be fixed by employing available redundancy elements.
2) Fusing. This includes fixing the defects by using redundant elements.
3) Burn-In Test. This includes a retest employing redundant memory cells to ensure proper functionality.
4) Final Component Test. This includes acceptance testing to ensure product quality.
5) Building of a Multichip Module. Most chips are employed on a board or module and are configured to include a plurality of chips. For example, Simm/Dimm/Rimm devices may be fabricated from two or more memory chips.
6) Module Test. The module is tested as a whole including solder joints, pins, etc. as well as the memory chips.

After fusing, however, a chip cannot be fixed anymore. This is detrimental for many reasons including:

1) Not all fails can be detected during wafer tests (for example, single cell failures (BLC and/or HT), word line failures (LPST), etc.).
2) Some additional fails will be introduced during packaging, burn in and building of the multichip module.
3) Additional parts will be lost due to excessive test guard band from wafer to component to module.
4) One fail on one component of a module results in scrapping the whole module, that is possibly 8 or 16 chips. (This is also one reason why testing is more intensive before building modules than after.)

Attempts have been made to address the problems described above. In U.S. Pat. No. 5,796,746 to W. M. Farnworth et al., entitled "Device and Method for Testing Integrated Circuit Device in an Integrated Circuit Module," concepts for repairing chips on modules are presented. The analysis aspect is handled in a tester where special pins (not connected [NC] pins according to JEDEC spec) are used for setting the electrical fuses.

Concepts for on chip fail bit map analysis (and consequently redundancy calculation) are presented in "Built in Self Repair for Embedded High Density SRAM," by Ily-oung Kim et al., Bell Laboratories; Proceedings ITC 1998 and "Semiconductor Manufacturing Process Monitoring Using Built-In Self-Test for Embedded Memories," by Ivo Schanstra et al., Philips Semiconductors; Proceedings ITC 1998. Both papers relate to SRAMs, and the concepts of these papers are limited to column redundancies.

Therefore, a need exists for a system and method for efficiently calculating and analyzing redundancies for semiconductor memories for repairing the semiconductor memories. A further need exists for repairing the semiconductor memories after packaging. A still further need exists for repairing multiple types of failures after packaging, e.g., column failures, row failures, cell failures, etc.

SUMMARY OF THE INVENTION

A method for analyzing failures for semiconductor memories, in accordance with the present invention, includes providing a memory device including at least one memory chip. The at least one memory chip includes a redundancy calculation region. The at least one memory chip is tested to determine failure addresses of failed components on each memory chip. The addresses of the failed components are input to the redundancy calculation region to compare the failure addresses to previous failure addresses stored in the redundancy calculation region to determine if new failures have been discovered. If a match exists between the previous failure addresses and the failure addresses, the failure addresses which match are terminated. Otherwise, the failure addresses are stored in the redundancy calculation region. It is then determined if the at least one memory chip is fixable based on the new failures which have been discovered.

In other methods, the memory device may include one of a single memory chip and a packaged multichip module. The step of testing the at least one memory chip may include employing built in self testing. The components may include one of a single memory cell, a row and a column. The row and column may each include a plurality of devices, for example, wordline, bitlines, etc. The method may be performed on-chip on the at least one memory chip. The step of inputting the addresses of the failed components to the redundancy calculation region may include the steps of inputting the addresses of the failed components to comparators to compare the addresses of the failed components which are currently discovered to the previous failure addresses stored in accumulators. The step of determining if the at least one memory chip is fixable based on the new failures which have been discovered may be performed by accumulating a number of matches between failure addresses and stored failure addresses and comparing the number of matches to a threshold value such that a matching event which causes the number of matches to equal the threshold is employed to designate the address of components to be repaired.

Another method for analyzing failures for semiconductor memories includes providing a memory device including at least one memory chip. The at least one memory chip includes a redundancy calculation region, and the redundancy calculation region is adapted to receive failure addresses of failed components. The redundancy calculation region includes comparators for comparing the failure addresses to previous failure addresses to determine if new failures have been discovered, a memory for selectively storing addresses of failures, and decision logic for determining if the memory device is fixable based on the new failures which have been discovered. The at least one memory chip is tested to determine failure addresses of failed components on each memory chip. The addresses of the failed components are input to the redundancy calculation region to compare the failure addresses to previous failure addresses stored in the redundancy calculation region by employing the comparators. If a match exists between the previous failure addresses and the failure addresses, the failure addresses which match are terminated, and a match count incremented. Otherwise, the failure address is stored in the redundancy calculation region. If the match count meets a threshold value, a must repair event is designated to repair the component using redundancies.

In other methods, the memory device may include one of a single memory chip and a packaged multichip module. The step of testing the at least one memory chip may include employing built in self testing. The components may include one of a single memory cell, a row and a column wherein the row and column may include a plurality of devices. The method may be performed on-chip on the at least one memory chip. The step of inputting the addresses of the failed components to the redundancy calculation region may include the steps of inputting the addresses of the failed components to the comparators to compare the addresses of the failed components which are currently discovered to the previous failure addresses stored in accumulators. The step of designating a must repair event may include the steps of accumulating a number of matches for between failure addresses and stored failure addresses and comparing the number of matches to a threshold value such that a matching event which causes the number of matches to equal the threshold is employed to designate the address of components to be repaired.

A system for analyzing failures for semiconductor memories, in accordance with the invention includes a self testing memory device including at least one memory chip adapted to determine failure addresses of failed components on the at least one memory chip. The at least one memory chip includes a redundancy calculation region. The redundancy calculation region is adapted to receive failure addresses of failed components. The redundancy calculation region also includes comparators for comparing the failure addresses to previous failure addresses to determine if new failures have been discovered, a memory for selectively storing addresses of failures, and decision logic for determining if the memory device is fixable based on the new failures which have been discovered.

In alternate embodiments, the memory device may include one of a single memory chip and a packaged multichip module. The at least one memory chip may include built in self testing. The components may include one of a single memory cell, a row and a column. The redundancy calculation region may include additional comparators to compare a number of matches between new failure addresses and previously stored failure addresses to a threshold value for designation a must-repair event. The redundancy calculation region may include adders to increment the number of matches when a match occurs. The at least one memory chip may include a plurality of redundancy calculation regions which are pipelined to store addresses of a plurality of failed components. The pipeline may include latches disposed between the redundancy calculation regions to provide synchronization therebetween.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

Figure 1:
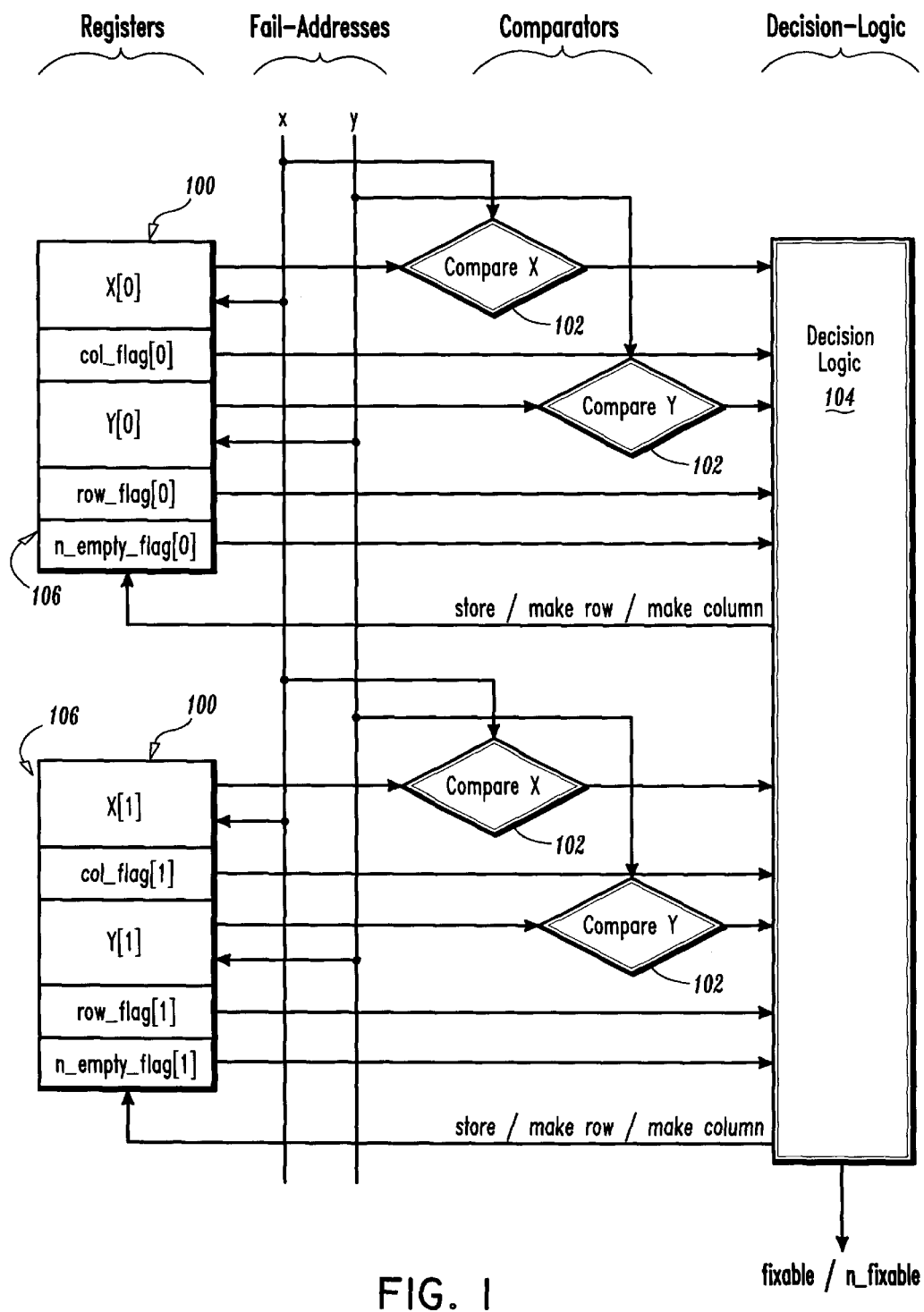
FIG. 1 is a block/flow diagram of a fail log with one available redundant row and one available redundant column for performing redundancy calculations and analysis in accordance with the present invention.

The present invention relates to testing and repairing semiconductor memories. A system and method for efficiently calculating and analyzing redundancies for semiconductor memories is provided for repairing the semiconductor memories. The present invention includes an on-chip implementation of redundancy calculation, however, off-chip implementations are also contemplated. The present invention makes redundancy calculations feasible for repair of semiconductor memories, such as DRAMs, after packaging and provides complete redundancy analysis to semiconductor memories, for example, embedded DRAMs.

To add redundancy calculation capability to test systems, in a cost effective way, a redundancy method is presented which is very efficient, i.e. small, fast and capable of finding nearly all possible solutions. Consequently, the method lends itself well to on-chip implementation, though it is not limited to this (for example, logic testers with embedded DRAM may be tested in an off-chip implementation).

In the present disclosure, two illustrative methods are presented. One method is capable of solving for one row plus one column redundancies and a second more generalized method is capable of solving for N×M column/row redundancies. While the second method may need more resources, it provides a solution for logic chips with a generous amount of embedded DRAM, for example. The first method preferably provides a very compact method for repairing packaged DRAM-chips that typically show very small numbers of fails. The methods provide an intelligent fail log. By comparing addresses of new fails with those of previous fails, the present invention is capable of deciding on the type of fail (row or column) during testing. Consequently, very few events have to be stored and the log can be small. For example, is two failures in a same row or column are found, it is not necessary to store both in memory since a redundant row or column can be employed. Sizes of rows and columns can be set by the designer of the chip. For example, a row may include 4 bitlines and a column may include 2 wordlines (for memories, powers or 2 are generally used, i.e., 1, 2, 4, 8, etc.). A grain may include a row and a column intersection, and in this example, a grain size is 2×4 (two wordlines by 4 bitlines). Redundant elements may be bundled to include several wordlines and bitlines. Redundant elements are preferably bundled at the grain size, i.e., 2×4 redundant elements.

The present invention permits repeated testing/fixing of devices on the component and module levels until all redundancies are used. This advantageously permits emphasis on module tests and less emphasis on component tests. At certain quality levels, it may even be possible to remove all component tests and to do burn in after building modules.

Because component and module testers, especially burn-in testers, do not have the capability to do any redundancy analysis, the present invention preferably employs the chip itself to provide a redundancy calculation which is efficient and fast. The present invention will now be described in illustrative terms based on several assumptions. The majority of fails are assumed to be fixed on the wafer level, leaving only a small number of fails for later steps. Testers for burn in, component and module tests are not capable of redundancy calculation, although embodiments of the present invention may be employed to do so. A BIST (built in self-test) function allows for access to redundant elements at component or module level. These redundant elements could otherwise not be efficiently addressed due to pin restrictions.

The present invention as illustratively described includes:
1) the use electrical fuses to activate redundancy elements;
2) testing all available redundancies at all test stages using BIST, so that unused redundancies remain available;
3) enhancing BIST with an efficient (simple & small) fail latch memory & redundancy calculator (as will be described in greater detail below);
4) adding test modes or states for blowing fuses according to the results of the internal redundancy calculator; and
5) adding IPL-modes for verifying that fusing has been successful (eliminating need to retest).

Figure 2:
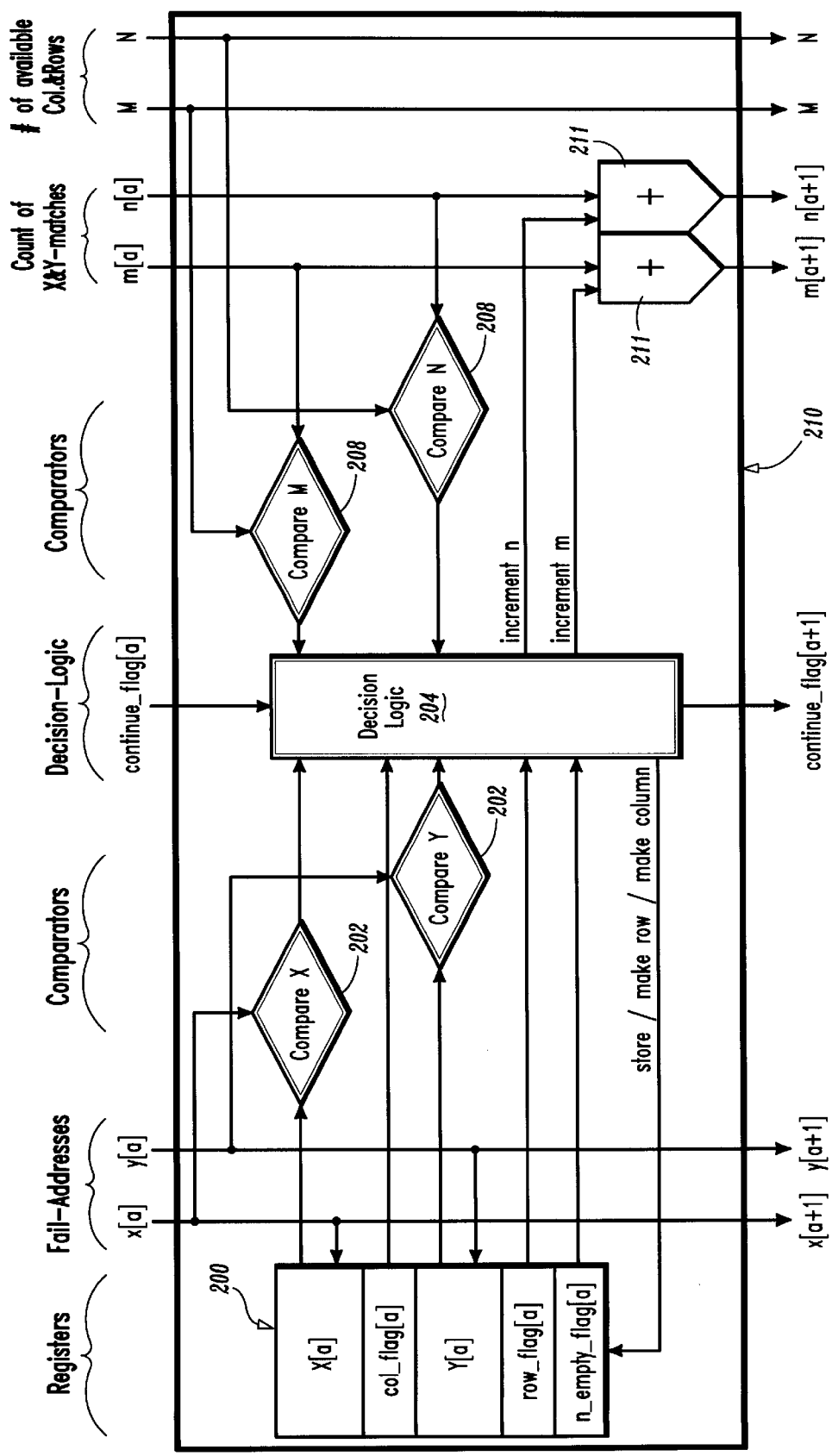
FIG. 2 is a block/flow diagram of another system/method for performing redundancy calculations and analysis for M by N redundancies in accordance with the present invention.
Figure 3:
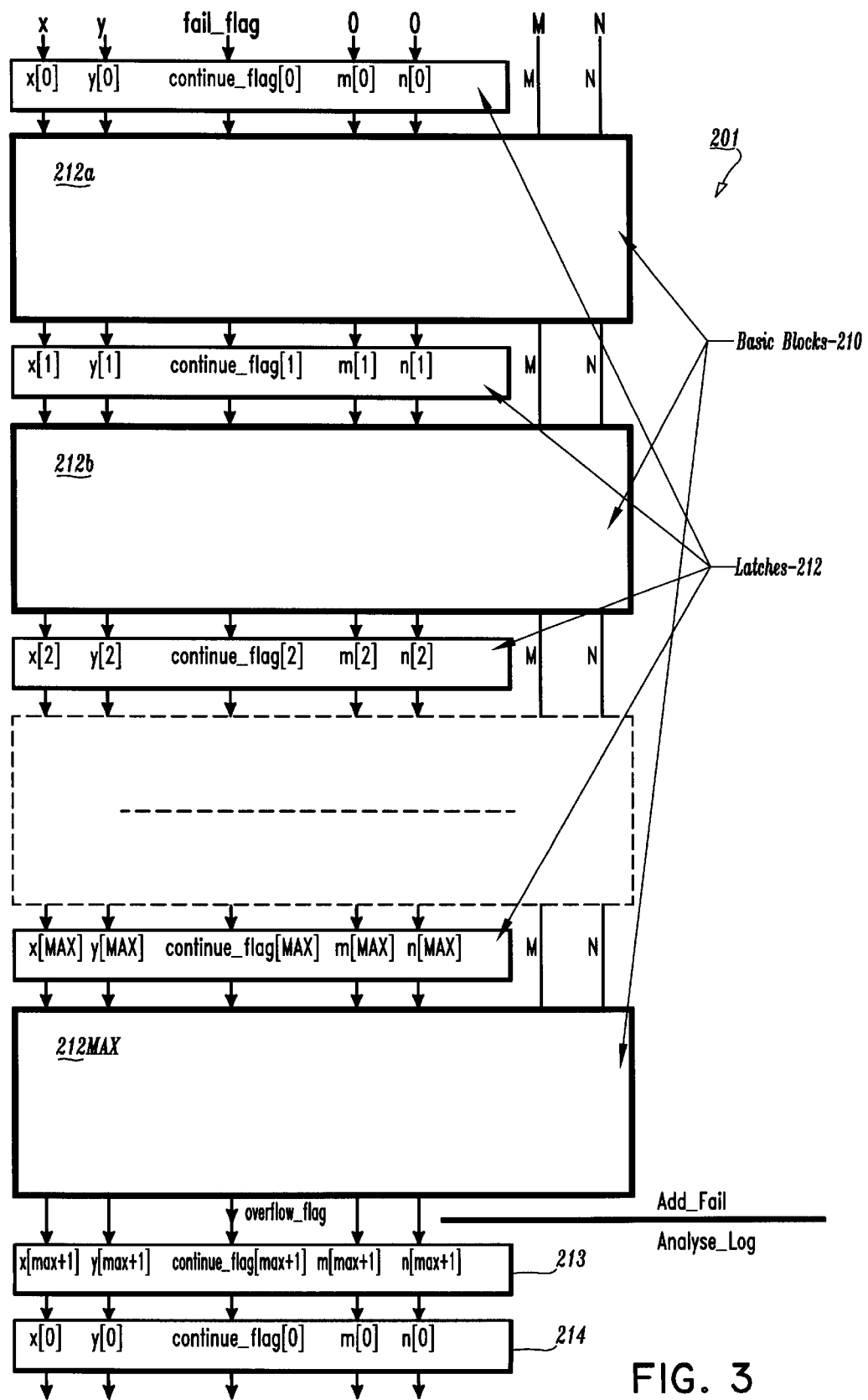
FIG. 3 is a block diagram of a pipelined system for performing redundancy calculation and analysis in accordance with the present invention.

It should be understood that the elements shown in FIGS. 1–3 may be implemented in various forms of hardware, software or combinations thereof. Preferably, these elements are implemented in software on one or more appropriately programmed semiconductor memory chips having a processor and memory capabilities and input/output interfaces. Referring now in specific detail to the drawings in which like reference numerals identify similar or identical elements throughout the several views, and initially to FIG. 1, a block/flow diagram of a system/method for performing on-chip redundancy calculations and analysis is shown. A semiconductor memory chip, for example, a DRAM, embedded DRAM, synchronous DRAM, or the like, is divided into redundancy domains. A redundancy domain is a region on the chip, for which redundancy is to be calculated without regard for other domains. In one example, four blocks of a typical 64M-SDRAM device do not interact in anyway when using redundant elements. For a 64 Mb-device, subsets of a block including 2×2 1M-segments (4 Mb each) constitute a good choice for a redundancy domain. This would divide a chip into 16 independent domains.

Figures 5A, 5B:
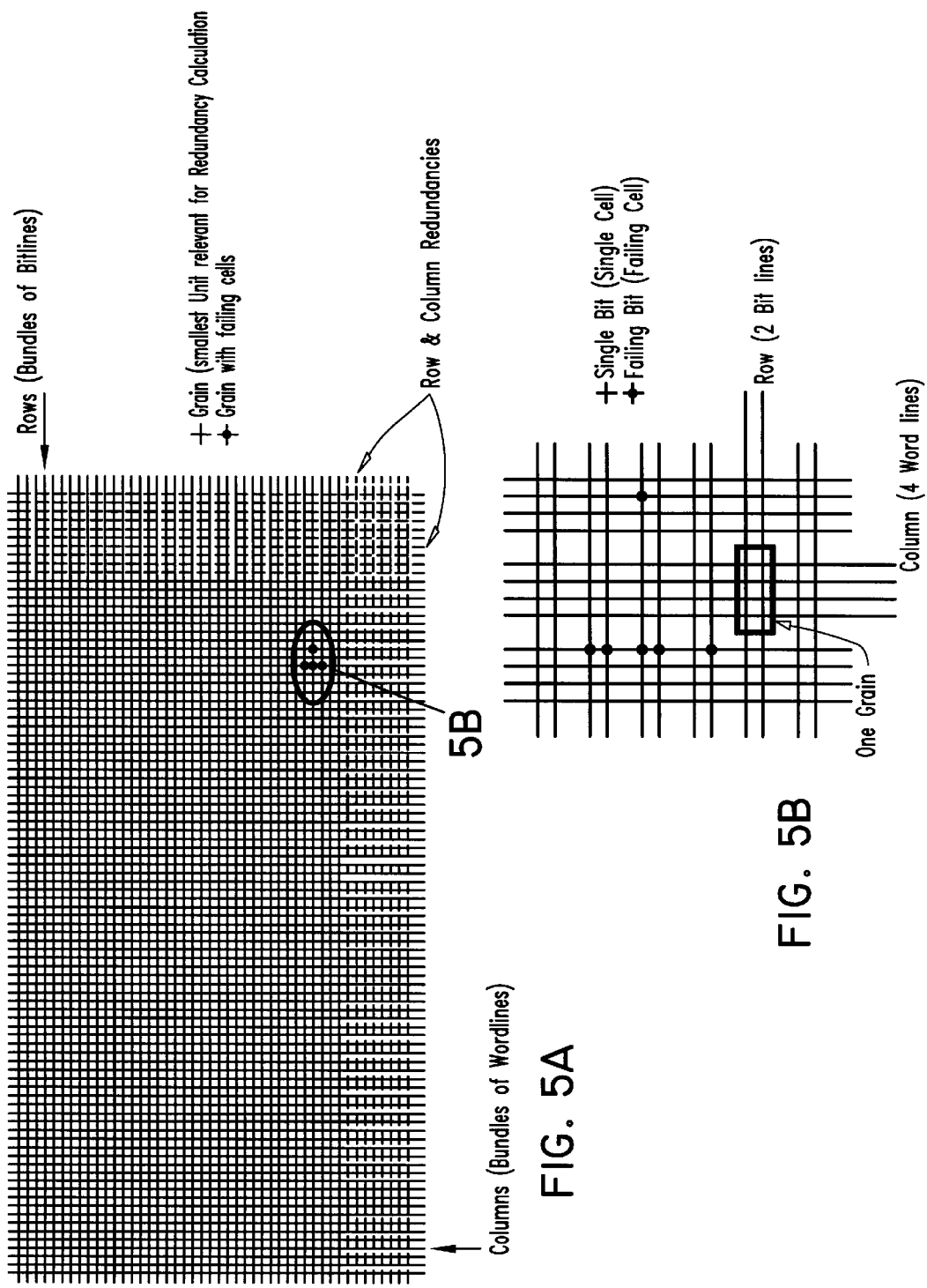
FIG. 5A is a map of a memory array having failed grains on which the present invention is employed.
FIG. 5B is a magnified map of an area 5B of FIG. 5A showing a grain and individual cells on which the present invention is employed.

A minimum grain for redundancy calculation may include the following characteristics. In extremis, this could be a 1 cell by 1 block minimum grain. But, since redundancies usually come in larger widths (e.g. double wordlines (WL) and quadruple bitlines (BL) (for example, for 4 Mb segments, etc.), a fuse is preferably employed to fix several WLs, or several BLs. Consequently, it is preferable to immediately reduce the fail-information to grains of the same length and width as the redundancies (i.e. 2 cells×4 cells for example). A row is thereby defined equal in size to a row redundancy, and a column is defined equal in size to a column redundancy. Thus, a grain is an intersection of a row with a column. FIGS. 5A and 5B show an example of a memory array 11 with redundancies 13, to demonstrate grain size for use with the invention.

With this, a system/method for 1 row and 1 column redundancy per domain includes the following in accordance with the present invention. Accumulators 100 are included which are capable of storing x/y-address pairs which are supplied as a fail log. Accumulators 100 preferably include registers or other memory storage devices. Additionally, each accumulator 100 has several flags which can also be stored, i.e. n_empty_flag, used_flag, row_flag, column_flag. Each accumulator 100 is associated with a pair of comparators 102, allowing current x and y failure addresses of failed minimum grains to be compared at the same time.

Each accumulator 100 is capable of representing a single cell, a row, a column or other minimum grain which may be assigned. Whenever a fail event is generated, the current xy address is compared to the stored xy addresses in accumulators 100. If no match is found, the new address is stored as enabled by decision logic 104. Considering rows and column addresses, if there is an xy match, no action is taken. If there is an x match, the corresponding accumulator is flagged as row (also disabling future y matches) by a row_flag as enabled by decision logic 104 (make row). If there is a y match, the corresponding accumulator is flagged as column (also disabling future x matches) by a column_flag as enabled by decision logic 104 (make column). In one embodiment, a domain is found not to be repairable (not fixable) if there is no memory left for storing an additional cell, or if two (in this case) columns or rows are flagged. Failure criteria is determined by decision logic 104 preferably provided on-chip. Decision logic incorporates all flags and defect information and outputs a single pass fail bit designating whether the chip, segment, etc. is fixable or not fixable (n-fixable).

In the embodiment shown in FIG. 1, a log memory 106 of accumulators 100 would be able to store two single cell or single grain fails, one single cell/grain fail and one column fail, one single cell/grain fail and one row fail or one row plus one column fail (e.g. cross fail).

Advantageously, with only two available redundancies, more than 90% of the DRAM components that fail at this stage of testing, can be repaired. Additionally, sequential application of the present invention permits fixing of a higher number of unrelated fails. Soft fails are usually specific to special tests, e.g. example, HT fails (single cells), LPST fails (word lines), BLC fails (single cells) etc. A test program may include many functional tests each looking for different types of fails. Each test checks the whole array. Test programs usually start with "easy" tests and go to more stringent tests later in the program to test different limitations with each test. Different fail mechanisms can cause different limit violations, and different failures may occur in different tests. If a redundancy calculation is performed after each test, the chip can be repaired if sufficient redundant elements exist and for the embodiment of FIG. 1 one row and one column are sufficient to make the repair.

The following symbols are employed in the FIGS. and are set forth for reference:

n,m . . . number of matches.

continue_flag . . . no equality between addresses and current block or memory is full, continue to the next block.

make_row, make_col . . . must-repair inferred, entry declared to be a row or column.

store_flag . . . past the last entry in the log without equality, store address and do not continue.

n_empty_flag . . . block empty flag.

M . . . maximum repairable number of rows per redundancy domain.

N . . . maximum repairable number of columns per redundancy domain.

Referring to FIG. 2, a block/flow diagram for another system/method in accordance with the present invention is shown. The system/method of FIG. 2 is particularly useful if more than one row or column per domain are in need of repair. The necessary resources rise accordingly.

An associative memory 200 stores xy pairs plus flags, similar to accumulators 100 of FIG. 1. xy-pairs are addresses of failed minimum grains in the chip, block, segment, etc. Whenever an xy pair is presented to memory 200, i.e., a fail address is entered x[a], y[a], memory 200 stores this address, if there is nonidentical xy-pair stored therein. Additionally, the number of x matches m[a] and the number of y matches n[a] is generated (this is the major difference from a normal associative memory) by inputting results from each comparator 202 to decision logic 204. If the number of X-matches (m or m[ ]) is larger than M, the new element becomes a row entry, since there is insufficient column redundancies to fix the element anyway. The same holds for Y-matches (n or n[ ]). If there are more than N, the new element becomes a column entry. After the completion of a test, superfluous single cell entries (covered by later row or column entries) have to be removed, and the residual events have to be efficiently assigned to the remaining redundant elements which are stored as M (redundancy rows remaining) and N (redundancy columns remaining). Comparators 208 are employed to compare x y match counts (m[ ] and n[ ]) to M and N, respectively.

A fail_flag (continue_flag) includes information for continuing processing or aborting processing due to failures. m and n are incremented by adders 211 if x and/or y matches are encountered. M and N are also input and are set depending on the design of the chip (i.e., the number of available redundancies). If matches occur decision logic 204 informs and enable memory 200 via store/make row/make column line. n_empty_flag is TRUE if memory or register 200 is not clear (not empty). If this flag is FALSE memory 200 is clear or empty, and the next fail address to pass is stored here. If the n_empty_flag is TRUE, then the fail address is passed (to a next block 210, see FIG. 3) or the address is terminated (the address is equal to the stored address as determined by comparators 202).

For the worst case scenario, the memory array has to be of size 2*M*N. Since decision logic 204 becomes more complex due to the counting of X and Y matches in addition to the tasks needed for logic 104 of FIG. 1, pipelining may be necessary to achieve the necessary speeds (See FIG. 3). Also Abook keeping@, i.e. keeping track of available redundancies, becomes more complicated.

Referring to FIGS. 2 and 3, a pipeline 201 of blocks 210 of FIG. 2 are shown. Between each block 210 is a latch 212 for providing sufficient delay and/or synchronization between adjacent blocks to permit appropriate pipelining of information between blocks 210. A first latch 212a receives x y address information of a first row and column. A fail_flag (continue_flag) includes information for continuing processing or aborting processing due to failures. M and N are zero initially and are incremented at each block 210 if x and/or y matches are encountered. M and N are also input and are set depending on the design of the chip (i.e., the number of available redundancies). A latch 213 is disposed after block 212 MAX and is used to store Add_fail which is the sum of the failures. An additional latch 214 is shown which indicates that more blocks for a multiple pipeline system may be employed in accordance with the invention.

Each block 210, sores an xy address. Fail addresses x[ ] and y[ ] are input to the pipeline 201 and wander down the stack trying to find a number of matches or trying to find the first unoccupied empty block 210 (e.g., n_empty_flag is FALSE in memory 200). If an address match is found, the number of matches is incremented and the fail address is terminated. Otherwise the address passes to the next block 210 and the process continues. An address match is determined if the stored address is the same address as the input address, or an address match is determined if the failed x (y) address describes a failed row (column) and the address is stored in the memory describes a row (column), i.e., same row (column failure).

The device under test is in need of repair (must-repair) when the fail address has counted (N−1) x-matches or (M−1) y-matches. The number of these matches is counted in m[ ] and n[ ] which are transferred down the pipeline with the fail addresses. When the Nth (or Mth) match is detected (n=N or m=M), a column or row must be repaired. The current stored address where the M or N occurred is then converted to a column or row address where a repair is needed so that a redundancy may be employed for the repair.

Adding the capability to do redundancy analysis to a BIST is employed for smaller number of available redundancies using the system/method of FIG. 1. Implementation of FIG. 1 is fairly simple and efficient (for example, only about 300 gates are needed). This permits the repair of most semiconductor memory components that fail in back-end manufacturing processes, i.e., during packaging. Assuming that a multichip module includes 8 individual chips, the number on non-fixable modules is up to eight times the number of non-fixable components. This implies that skipping the tests prior to module build is viable only if the number of not fixable chips is extremely small.

To achieve this, it may be necessary to allow for a higher number of redundancies. A cheap alternative to the systems/methods of FIG. 2 and/or 3 may be to employ the system of FIG. 1 to sequentially fix the chip after each individual test. If the test flow starts with relaxed tests and continues to tighter corners, more fails will be found further down the flow. Since the harder fails have been fixed previously, the availability of single row and column redundancies may be sufficient to fix problems as they are determined and then continue to the next step.

Using the systems/methods of FIGS. 2 and 3 may be more economically and spatially expensive than the system/method of FIG. 1. However, the systems/methods of FIGS. 2 and 3 provide the advantage of higher numbers of redundancies which can be used. Advantageously, this permits wafer level fixing without any support from the tester. Since the redundancy analysis is a very expensive part of the wafer level tester, this is especially attractive. This is particularly advantageous for embedded memories, where logic testers have to be used. Additionally, complicated logic is cheaper to implement on embedded devices than on pure memories.

To keep cost down, it is preferable to keep 2*M*N small by choosing sensible redundancy domains. For example, current 64M devices include memory blocks. Each block may have only 4 independent domains, with, for example, 12 row and 8 column redundancies. This is a high number.

Implementations of the present invention preferably are capable of comparing a column address (about 8 bits) within one cycle (about 6 ns). For row addresses (about 10 bits), the same speed is desirable (for simplicity), though not necessary. Bringing up a new wordline takes much more time. For a DRAM, row and column comparators 220 of the present invention can also be shared to reduce access time.

Advantageously, in one embodiment, x addresses can be sent down the pipeline 201 before y addresses. A new y address would trigger a readout at the last x address presented, whereas a new x address simply sets its value and waits for the next y trigger in an input or output operation. In this way, the x address can be sent down the pipeline ahead of y and store the results of comparison (1 bit per block 210). Then, if a fail occurs, the y address is sent down the pipeline using the same bus and the same comparators as the x-address.

Figure 4:
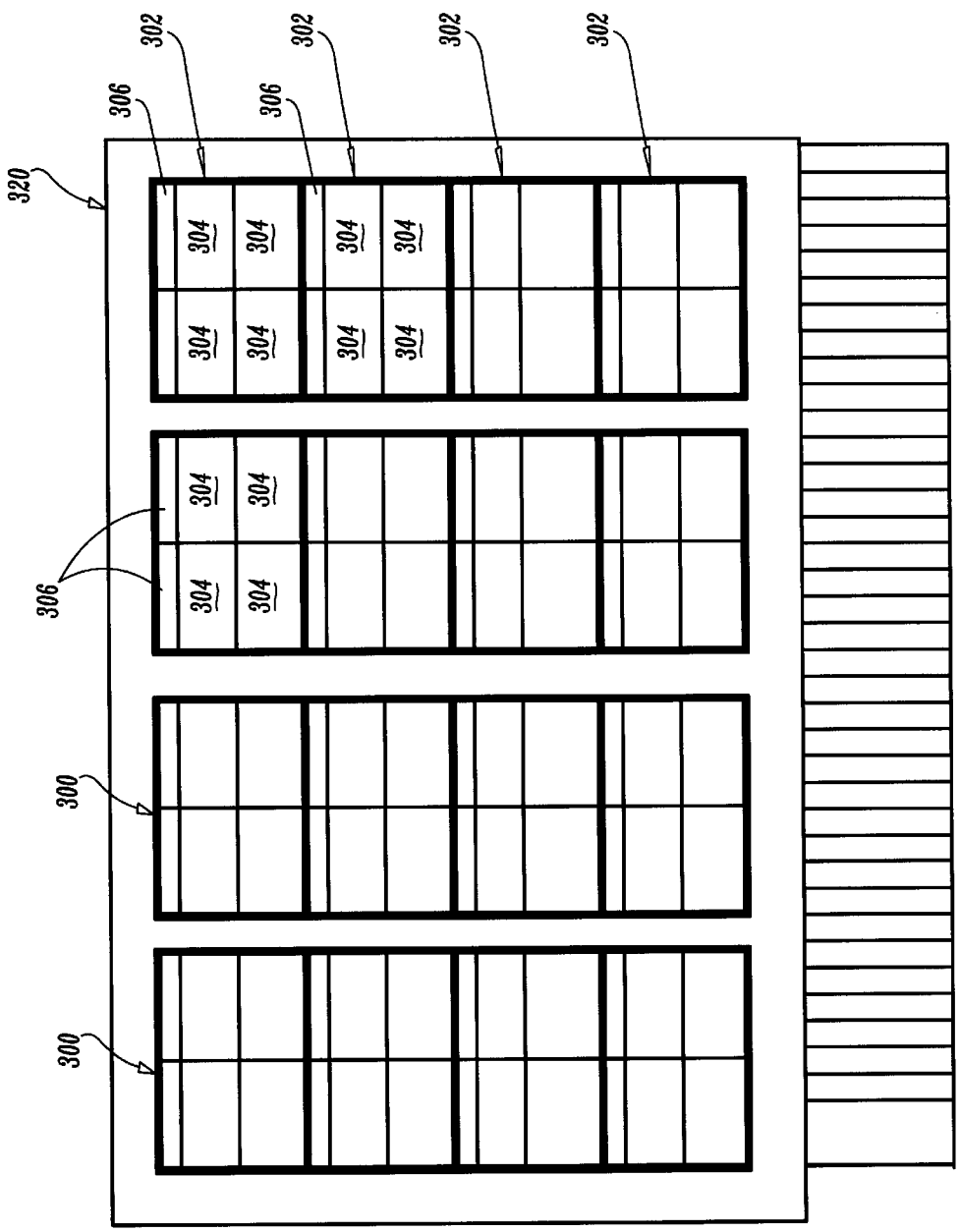
FIG. 4 is a block diagram of a packaged multichip memory module employing the present invention.

Referring to FIG. 4, a packaged multichip module 320 is illustratively shown. For four blocks 302 of a 64M chip 300, subsets 304 of each block include 2×2 1M-segments (4 Mb each) which are designated as a redundancy domain for employing the invention. This would divide chip 300 into 16 independent domains. An on-chip region (redundancy calculation/analysis region) 306 is provided for employing the system for calculating/analyzing redundancies in accordance with the present invention. Chip 300 is shown as part of a packaged multichip module 320.

Once modules or components have been through final test, there is no additional test gate. If repairs are done based on the results of the final test, these repairs have to be verified. Running the same test again is one possibility. This may be expensive (retest all parts) or cause logistic difficulties (retest fixed parts). Another possibility is to prove that fixing the chips/module always works (with always implying a fail rate that is much smaller than the rate guaranteed to the customer). A third possibility includes the addition of special test modes that allow for verifying the success of setting the electrical fuses. Since the redundant elements see the full test flow, the functionality of the array does not have to be proven a second time. This permits qualification of product with a flow that does not require retesting. Other possibilities are contemplated as well. Two illustrative software programs are included in the APPENDIX to demonstrate the implementations described above for FIGS. 1 and 2 above Having described preferred embodiments for a efficient redundancy calculation system and method for various types of memory devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

APPENDIX:

Sample implementations of methods in PASCAL for the present invention:

There are two Pascal-functions:

[1] Add_New_Fail, which simulates the behavior of the fail log when a new fail is found; it is always called whenever a fail is detected

[2] Analyze_Log, which checks whether the solution is valid and sorts (Method B) and finds rows and columns with a very small number of failing grains; in the end single grains are replaced by rows or columns, so that the fuse procedure need not take care of that.

Function Add_New_Fail is to be called, whenever a fail is detected. Function Analyse_Log is to be called before fusing.

This description is not optimized and is for illustrative purposes only. Variations are desirable. Since tests are driven from outside the redundancy unit, a program loop can not be described. Not included in these functions is the housekeeping necessary to prevent the use of bad redundant elements. There are too many possible variants that depend on the detailed implementation of a DRAM.

Description of Method A (FIG. 1) in Pascal: (It is assumed, that values are initialized to 0 or FALSE)

```
MODULE RedundancyA;
VAR                                         (* global variables*)
X, Y                                        ARRAY [0 ..1] OF INTEGER;
                                            (* fail log*)
Row_Flag, Col_Flag, N_Empty_Flag,           ARRAY [0 ..1] OF
BOOLEAN; (* flags for log *)
N_Fixable_Flag                              BOOLEAN;    (* Bad Luck if this
                                                        value is TRUE *)
(* global procedures   *)
PROCEDURE Add_New_Fail ( x,y : integer)
      (* x & y are grain-address, i.e. row/column addresses
minus a few bits *)
      VAR
      x_match, y_match,
      make_row, make_col,
      put_fail                              ARRAY [0 .. 1] OF
                                            BOOLEAN;
      add_fail                              BOOLEAN;
      BEGIN
      (* find matches *)
      x_match [0] :=          (    (X[0]      = x)       OR
                                   Col_Flag[0]           )        AND
N_Empty_Flag [0];
      y_match [0] :=          (    (Y[0]      = y)       OR
                                   Row_Flag[0]           )        AND
N_Empty_Flag [0];
      x_match [1] :=          (    (X[1]      = x)       OR
                                   Col_Flag[1]           )        AND
N_Empty_Flag [1];
      y_match [1] :=          (    (Y[1]      = y)       OR
```

-continued

```
                              Row_Flag[1]           )AND
N_Empty_Flag [1];
      (* if no matches are found: where to put x/y?*)
      add fail                 : = NOT    ( x_match [0] OR
                                          x_match[1] OR
y_match[0] OR y_match[1]      );
      put_fail [0]             :=                   add_fail AND NOT
N_Empty_Flag [0];
      put_fail [1]             : = NOT   put_failed [0]    AND
                                                   add fail
                                                   AND NOT
N_Empty_Flag [1];
      (* if match is found: declare row or column ?*)
      make_col [0]      := x_match [0] AND NOT y_match[0];
      make_row [0]      := y_match [0] AND NOT x_match[0];
      make_col [1]      := x_match [1] AND NOT x_match[1];
      make_row [1]      := y_match [1] AND NOT y_match[1];
(* is there still memory available to store x/y ? *)
      N_Flexible_Flag:= N_Fixable_Flag OR( add_fail AND
NOT (put_fail [0] OR put_fail [1])  );
      (* execute conversion to row/column *)
      Col_Flag [0]             := Col_Flag    [0]     OR make_col
                                              [0];
      Row_Flag [0]             := Row_Flag    [0]     OR make_row
                                              [0];
      Col_Flag [1]             := Col_Flag    [1]     OR make_col
                                              [1];
      Row_Flag [1]             := Row_Flag    [1]     OR make_row
                                              [1];
      (*     store x/y *)
      IF     put_fail [0]
             THEN BEGIN
             X[0] :=  x;
             Y[0] :=  y;
             END;
      IF     put_fail [1]
             THEN BEGIN
             X[1] :=  x;
             Y[1] :=  y;
             END;
      END   Add_New_Fail;
PROCEDURE Analyze_Log()
      BEGIN
      (* this line checks if an invalid solution, i.e. a
double column or a double row solution have been found *)
      N_Fixable_Flag = N_Fixable_Flag OR(Row_Flag[0] AND
             Row_Flag[1])OR(COl_Flag[0]AND
             Col_Flag [1]0;
      (*    ok, row preference; could also be implemented
            as column
preference:    *)
      IF    (     NOT Row_Flag [1]       )
            THEN Row_Flag     [0] =     TRUE;
            ELSE Col_Flag     [0] =     TRUE;
      IF    (     NOT Col_Flag [0]       )
            THEN Col_Flag     [1] =     TRUE;
            ELSE Row_Flag     [1] =     TRUE;
      END Analyze_Log.
END RedundanceA;
```

Description of Method B (FIGS. 2 and 3) in Pascal: (It is assumed, that values are initialized to 0 or FALSE)
Add_Fail describes a pipelined fail_log. Each clock pulse equals one call of Add_Fail. If there is no fail event to be processed, Fail_Flag is FALSE, otherwise it is TRUE.

```
MODULE RedundancyB;
CONST
MM                    ???         (*number of available row-
                                  redundancies   *)
NN                    ???         (*number of available column
                                  redundancies *)
MAX                   ???         (*number of available log entries
                                  *)
                                  (*should be of the order 2*M*N *)
VAR
(* global variables *)
M = MM          INTEGER;
N = NN          INTEGER;
(* the following variables are assumed to initialize to 0 or
False *)
X,Y                         ARRAY [0..MAX] OF
                            INTEGER; (*fail log (registers)*)
Row_Flag,Col_Flag,N_Empty_Flag,       ARRAY [0..MAX] OF
                                      BOOLEAN; (*flags for log
                                      *)
x,y                         ARRAY [0..MAX+1] OF INTEGER;
                            (*part of pipeline; [0] is new
                            fail *)
m,n                         ARRAY [0..MAX+1] OF INTEGER;
                            (*part of pipeline; [0] always
                            0 *)
Continue_Flag         ARRAY [0..MAX+1] OF BOOLEAN; (*part of
                            pipeline; [0] alw. TRUE *)
Overflow_Flag, N_Fixable_Flag BOOLEAN          (*Bad Luck if these
                                               values are True*)
(* global procedures *)
PROCEDURE Add_New_Fail      (x, y : INTEGER; fail_flag :
                            BOOLEAN )
          (* x & y are grain-addresses, i.e. row/column
addresses minus a few bits *)
          (* fail_flag is TRUE if address represents a fail;
otherwise it is false *)
          VAR
          x_match, y_match
          make_row, make_col,
          store,
          increment_m, increment_n            BOOLEAN;
          BEGIN
          x[0]   := x;
          y[0]   := y;
          Continue Flag[0] = fail_flag;
          n[0]   :=0;
          m[0]   :=0;
          FOR a:=MAX TO 0 DO (* this loop is supposed to
represent a pipeline *)
                 BEGIN
                 (* is there something to compare to ? *)
                 store      :=     ( NOT N_Empty_Flag[a] AND
                                  Continue_Flag[a-1] );
                 IF store
                      THEN BEGIN
                      X[a]   := x[a];
                      Y[a]   := y[a];
                      N_Empty_Flag[[a]      := TRUE;
                      Continue_Flag[a+1]:= FALSE;
                      END;
                 If ( NOT store)
                      BEGIN
                      (* find match *)
                      x_match    := ( (X[a] = x[a])            OR Col_Flag[a] )
AND N Empty_Flag[a];
                      y_match    := ( (Y[a] = y[a])            OR Row_Flag[a] )
AND N_Empty_Flag[a];
                      (* x and y match: *)
                      Continue_Flag[a+1] :=Continue Flag[a] AND NOT
```

-continued

```
( x_match AND y_match);
                (* x or y match: *)
                (* on match, increment counters: *)
                increment_m      := ( Continue_Flag[a] and
x_match[a] );
                increment n      := ( Continue_Flag[a] and
y_match[a] );
        IF increment_m
                THEN m[a+1]      := m[a] +1;
                ELSE m[a+1]      := m[a];
        If increment_n
                THEN n[a+1]      := n[a] +1;
                ELSE n[a+1]      := n[a];
                (* can row/ column be determined ? (must
repair)*)
                make row    = (m[a+1] >= M);
                make_col    = (n[a+1] >= N);
                row_flag[a]      = make_row;
                col_flag[a]      = make_col;
                Continue Flag[a+1]   := Continue_Flag[a+1] AND
NOT ( make_row OR make_col );
                END;
        END; (*loop/pipeline*)
        Overflow_Flag := Overflow_Flag OR
Continue_Flag[MAX];
END Add_New_Fail;
```

What is claimed is:

1. A method for analyzing failures for semiconductor memories comprising the steps of:

providing a memory device including at least one memory chip, the at least one memory chip including a redundancy calculation region;

testing the at least one memory chip to determine failure addresses of failed components on each memory chip;

inputting the addresses of the failed components to the redundancy calculation region;

comparing the failure addresses to previous failure addresses stored in the redundancy calculation region to determine if new failures have been discovered;

if a match exists between the previous failure addresses and the failure addresses, terminating the failure addresses which match, otherwise storing the failure addresses in the redundancy calculation region;

determining if the at least one memory chip is fixable based on the new failures which have been discovered.

2. The method as recited in claim 1, wherein the memory device includes one of a single memory chip and a packaged multichip module.

3. The method as recited in claim 1, wherein the step of testing the at least one memory chip includes employing built in self testing.

4. The method as recited in claim 1, wherein the components include one of a single memory cell, a row and a column.

5. The method as recited in claim 4, wherein the row includes a plurality of devices.

6. The method as recited in claim 4, wherein the column includes a plurality of devices.

7. The method as recited in claim 1, wherein the method is performed on-chip on the at least one memory chip.

8. The method as recited in claim 1, wherein the step of inputting the addresses of the failed components to the redundancy calculation region includes the steps of inputting the addresses of the failed components to comparators to compare the addresses of the failed components which are currently discovered to the previous failure addresses stored in accumulators.

9. The method as recited in claim 1, wherein the step of determining if the at least one memory chip is fixable based on the new failures which have been discovered is performed by accumulating a number of matches between failure addresses and stored failure addresses and comparing the number of matches to a threshold value such that a matching event which causes the number of matches to equal the threshold is employed to designate the address of components to be repaired.

10. A method for analyzing failures for semiconductor memories comprising the steps of:

providing a memory device including at least one memory chip, the at least one memory chip including a redundancy calculation region, the redundancy calculation region adapted to receive failure addresses of failed components, the redundancy calculation region further comprising:

comparators for comparing the failure addresses to previous failure addresses to determine if new failures have been discovered, a memory for selectively storing addresses of failures, decision logic for determining if the memory device is fixable based on the new failures which have been discovered;

testing the at least one memory chip to determine failure addresses of failed components on each memory chip;

inputting the addresses of the failed components to the redundancy calculation region;

comparing the failure addresses to previous failure addresses stored in the redundancy calculation region by employing the comparators;

if a match exists between the previous failure addresses and the failure addresses, terminating the failure addresses which match and incrementing a match count, otherwise storing the failure addresses in the redundancy calculation region; and if the match count meets a threshold value, designating a must repair event to repair the component using redundancies.

11. The method as recited in claim 10, wherein the memory device includes one of a single memory chip and a packaged multichip module.

12. The method as recited in claim 10, wherein the step of testing the at least one memory chip includes employing built in self testing.

13. The method as recited in claim 10, wherein the components include one of a single memory cell, a row and a column.

14. The method as recited in claim 13, wherein the row includes a plurality of devices.

15. The method as recited in claim 13, wherein the column includes a plurality of devices.

16. The method as recited in claim 10, wherein the method is performed on-chip on the at least one memory chip.

17. The method as recited in claim 10, wherein the step of inputting the addresses of the failed components to the redundancy calculation region includes the steps of inputting the addresses of the failed components to the comparators to compare the addresses of the failed components which are currently discovered to the previous failure addresses stored in accumulators.

18. The method as recited in claim 10, wherein the step of designating a must repair event includes the steps of accumulating a number of matches between failure addresses and stored failure addresses and comparing the number of matches to a threshold value such that a matching event which causes the number of matches to equal the threshold is employed to designate the address of components to be repaired.

19. A system for analyzing failures for semiconductor memories comprising:

a self testing memory device including at least one memory chip adapted to determine failure addresses of failed components on the at least one memory chip, the at least one memory chip including a redundancy calculation region;

the redundancy calculation region adapted to receive failure addresses of failed components, the redundancy calculation region further comprising:

comparators for comparing the failure addresses to previous failure address to determine if new failures have been discovered, said failure addresses compared by said comparators comprising failure addresses not previously matched to a stored failure address;

a memory for selectively storing address of failures which match previous failure addresses; and decision logic for determining if the memory device is fixable based on the new failures which have been discovered.

20. The system as recited in claim 19, wherein the memory device includes one of a single memory chip and a packaged multichip module.

21. The system as recited in claim 19, wherein the at least one memory chip includes built in self testing.

22. The system as recited in claim 19, wherein the components include one of a single memory cell, a row and a column.

23. The system as recited in claim 19, wherein the redundancy calculation region includes additional comparators to compare a number of matches between new failure addresses and previously stored failure addresses to a threshold value for designation a must-repair event.

24. The system as recited in claim 19, wherein the redundancy calculation region includes adders to increment the number of matches when a match occurs.

25. The system as recited in claim 19, wherein the at least one memory chip includes a plurality of redundancy calculation regions which are pipelined to store addresses of a plurality of failed components.

26. The system as recited in claim 25, wherein the pipeline includes latches disposed between the redundancy calculation regions to provide synchronization therebetween.

\* \* \* \* \*